United States Patent [19]
Mukai et al.

[11] Patent Number: 5,869,430
[45] Date of Patent: Feb. 9, 1999

[54] HIGH TEMPERATURE SUPERCONDUCTING WIRE USING OXIDE SUPERCONDUCTIVE MATERIAL

[75] Inventors: Hidehito Mukai; Kenichi Sato; Nobuhiro Shibuta, all of Osaka, Japan

[73] Assignee: Sumitomo Electric Industries, Ltd., Japan

[21] Appl. No.: 479,898

[22] Filed: Jun. 7, 1995

Related U.S. Application Data

[63] Continuation of Ser. No. 178,345, Jan. 6, 1994, abandoned, which is a continuation of Ser. No. 854,134, Mar. 19, 1992, abandoned.

[30] Foreign Application Priority Data

| Mar. 20, 1991 | [JP] | Japan | 3-056688 |
|---|---|---|---|
| Mar. 20, 1991 | [JP] | Japan | 3-056698 |

[51] Int. Cl.$^6$ .................................................. H01B 12/00
[52] U.S. Cl. ....................... 505/230; 505/231; 505/232; 505/236; 505/704; 174/125.1; 428/702; 428/930; 428/469; 428/373; 428/381
[58] Field of Search ..................... 428/688, 930, 428/689, 702, 469, 373, 381; 505/701, 702, 704, 230, 231, 238, 239, 232, 236; 174/125.1

[56] References Cited

U.S. PATENT DOCUMENTS

| 4,849,288 | 7/1989 | Schmaderer et al. | 428/368 |
|---|---|---|---|
| 5,017,553 | 5/1991 | Whitlow et al. | 505/1 |
| 5,104,849 | 4/1992 | Shiga et al. | 428/688 |
| 5,132,278 | 7/1992 | Stevens | 505/704 |
| 5,151,406 | 9/1992 | Sawada et al. | 428/688 |

FOREIGN PATENT DOCUMENTS

| 0 283 312 A2 | 9/1988 | European Pat. Off. . |
|---|---|---|
| 0305820 | 3/1989 | European Pat. Off. . |
| 0311337 | 4/1989 | European Pat. Off. . |
| 0 357 779 | 3/1990 | European Pat. Off. . |
| 0 358 779 | 3/1990 | European Pat. Off. . |
| 0 397 943 A1 | 11/1990 | European Pat. Off. . |
| 0 449 316 | 10/1991 | European Pat. Off. . |

OTHER PUBLICATIONS

Wilhelm et al., "Präparation und Eigenschaffen von Silberbandleitem mit Kern aus B(P)SCCO 11OK–Phase," Supraleitung und Teiftemperaturkechnik: for the Status Seminar Feb. 25–27, 1991; pp. 400–403.

Sekine et al., "Metallurgical Studies and Optimization of Critical Current Density in Bi–(Pb)–Sr–Ca–Cu–O Superconductors," Japanese Journal of Applied Physics, vol. 28, No. 7, Jul. 1989, pp. 1185–1188.

Wada et al., "Strain Effects in Oxide Superconductors," ICMC '90 Topical Conference on Materials Aspects of High Temperature Superconductors, May 1990, pp. 1011–1016.

(List continued on next page.)

*Primary Examiner*—Marie Yamnitzky
*Attorney, Agent, or Firm*—Pennie & Edmonds LLP

[57] ABSTRACT

According to an aspect, a tape-type high temperature superconducting wire is provided by applying compression work to a wire manufactured by drawing so that an oxide high temperature superconductor is divided into a plurality of superconductors by a stabilizing material of substantially equal thickness. According to another aspect, a high temperature superconducting wire is provided by packing a material which becomes a superconductor portion into a metal sheath which becomes the stabilizing material and applying drawing work thereto, followed by bundling an assembly of these wire in a metal sheath and applying drawing work thereto. The thickness of the superconductor portion is approximately 10% or less than the thickness of the wire. The critical current density is hardly decreased in the high temperature superconducting wire even if subjected to bending work.

11 Claims, 3 Drawing Sheets

OTHER PUBLICATIONS

Seido et al, "Fabrication and Characteristics of Multi–core Tl–Ba(Sr)–Ca–Cu Oxide Superconducting Tapes," Advances in Superconductivity II [Proceedings of the 2nd International Symposium on Superconductivity ISS '89), Nov. 14–17, 1989, Tsukuba, Japan, pp. 401–404.

Mukai et al., "Properties of Ag/Bi–Based Superconducting Long Wire and Test Coil," Advances in Superconductivity III [Proceedings of the 3rd International Symposium on Superconductivity (ISS '90], Nov. 6–9, 1990, Sendai, Japan, pp. 607–612.

Geballe, "Paths to Higher Temp. Supercond" Science vol. 259, Mar. 12, 1993 pp. 1550–1551.

"Cuprate Superconductors" May 10, 1993 C & EN, pp. 4–5.

HIGH TEMPERATURE SUPERCONDUCTING WIRE USING OXIDE SUPERCONDUCTIVE MATERIAL

This is a continuation of application Ser. No. 08/178,345, filed Jan. 06, 1994, now abandoned, which is a continuation of application Ser. No. 07/854,134, filed Mar. 19, 1992, now abandoned.

BACKGROUND OF THE INVENTION

1. Field of the Invention

The present invention relates to a high temperature superconducting wire using oxide high temperature superconductive material, and more particularly, to a multifilamentary superconducting wire that can maintain a high critical current density applicable to magnets, cables, etc.

2. Description of the Background Art

In recent years, attention is directed to ceramics based, i.e. oxide based, superconductors as the superconductive material having a higher critical temperature. Particularly, yttrium, bismuth, and thallium based superconductors having high critical temperatures of 90K, 110K, and 120K, respectively, show practical usage potential.

The applicability of these high temperature superconductive materials to cables, bus bars, current leads, coils and the like have been considered, taking the approach of elongating the superconductive material for these applications.

A known method of obtaining an elongated oxide superconducting wire includes the steps of covering material powder with a metal sheath and applying thermal treatment for turning the material powder into a superconductor to result in a wire of a superconductor covered with a metal sheath.

There is another approach of manufacturing a wire having a plurality of oxide high temperature superconductor filaments, similar to conventional metal based and compound based superconductors.

Not only high critical temperature, but also high critical current density is required to apply high temperature superconducting wires to cables and magnets. High temperature superconducting wires must maintain the required critical current density in the used magnetic field, and even under practical usage circumstances where it is bent at a predetermined curvature after being subjected to thermal treatment. In view of the foregoing, a high temperature superconducting wire is desired that does not have critical current density reduced even after being subjected to bending work.

SUMMARY OF THE INVENTION

An object of the present invention is to provide a high temperature superconducting wire in which reduction of critical current density is suppressed even when subjected to bending strain.

Another object of the present invention is to provide a bending worked high temperature superconducting wire that has a sufficient high critical current density, and that has practical applicability to cables, bus bars, current leads, coils, and the like.

According to an aspect of the present invention a tape-type high temperature superconducting wire, having a high temperature superconductor formed of oxide high temperature superconducting material arranged in a stabilizing material is provided, in which the tape-type wire is formed by applying compressive load to a wire manufactured by drawing so that a high temperature superconductor is divided into a plurality of superconductors by a stabilizing material of substantially equal thickness.

According to another aspect of the present invention, a high temperature superconducting wire having a high temperature superconductor formed of oxide superconductive material arranged in a stabilizing material is provided, in which the wire is manufactured by drawing so that a high temperature superconductor is divided into a plurality of superconductors by a stabilizing material of substantially equal thickness.

The high temperature superconducting wire of the above aspects can be manufactured by preparing a plurality of wires having an oxide high temperature superconductor covered with a stabilizing material of equal thickness, bundling these wires within a metal sheath, and applying plastic working thereto. The high temperature superconducting wire can be manufactured by preparing a stabilizing material having a plurality of communicating holes formed at equal spacing, forming an oxide high temperature superconductor in the plurality of holes in the stabilizing material, and then applying plastic working thereto.

In the above-described aspects, the thickness of respective divided high temperature superconductors preferably is approximately 10% or less than the thickness of the high temperature superconducting wire.

In this specification, the term "thickness" means the size in the cross-sectional direction of a linear product. The term "thickness" refers to the commonly used meaning of thickness in a tape-type wire, and refers to the diameter in a wire having a substantially circular cross-section.

In the above-described aspects, the high temperature superconducting wire where the thickness of each divided high temperature superconductor is approximately 10% or less than the thickness of the wire can be processed so as to have a bending strain of 0.3% or below. A high temperature superconducting wire subjected to bending work with a bending strain of 0.3% or below maintains a critical current density close to that prior to being worked.

In the specification, "bending strain" is defined as follows:

$$\text{bending strain (\%)} = \frac{\text{wire thickness}}{\text{bending diameter}} \times 100$$

In the above-described aspects, the high temperature superconducting wire where the thickness of the divided high temperature superconductor is approximately 10% or less than the thickness of the wire may preferably be applied to a wire that is bent at a bending strain of 0.3% or below. This wire comprises cables, bus bars, and current leads.

The stabilizing material according to the present invention is unreactive to high temperature superconductors, and is preferably easily processed. The stabilizing material includes silver, silver alloy, etc.

In the present invention, yttrium, bismuth, and thallium based oxide superconductors are used as the high temperature superconductor. A bismuth based high temperature superconductor is more preferable because of its high critical temperature, high critical current density, low toxicity and unnecessity of rare earth elements.

The superconducting wire using an oxide superconducting material is desired to be processed in a tape-type manner to increase the critical current density. A tape-type high temperature superconducting wire can be bent at a small bending diameter since it is thin in comparison with a wire of round configuration. A tape-type wire is particularly applicable to coils and the like.

A wire having a high temperature superconductor divided into a plurality of superconductors by a stabilizing material of substantially equal thickness is compression-worked to provide a tape-type wire where the thickness of the high temperature superconductor is substantially constant. A wire having high temperature superconductors distributed at a constant distance exhibits a high critical current density with almost no decrease in the density even when subjected to bending work.

If the thickness of the stabilizing material surrounding the high temperature superconductor is not constant, the thickness of the high temperature superconductor after the work process will be uneven because of local difference of levels in receiving the compression work. A partially thinned superconductor may limit the critical current value of the entire wire. This variation degrades the critical current density of the high superconducting wire. A partially thickened superconductor provides a greater strain to the wire at the time of its bending work.

According to a further aspect of the present invention, a high temperature superconducting wire having a plurality of superconductor portions formed of an oxide high temperature superconductive material arranged in a stabilizing material is provided, which is formed by filling a metal sheath serving as the stabilizing material with a material which becomes the superconductor portion and applying drawing work thereto, followed by bundling an assembly of these wires in a metal sheath and applying drawing work thereto, in which the thickness of each superconductor is 10% or less than the thickness of the entire wire.

A multifilamentary superconducting wire according to the present aspect can be obtained by covering powder of an oxide high temperature superconductor or powder of a precursor with a metal sheath such as of silver to form a round wire by drawing, followed by gathering a plurality of these wires to be covered with a metal sheath such as of silver and applying drawing work thereto. If necessary, the wire may be subjected to compression process such as rolling to result in a tape-type configuration, or may be sintered by thermal treatment under the round configuration.

The multifilamentary superconducting wire is preferably metal-covered from the standpoint of stability. This metal preferably does not react with high temperature superconductors, can be easily processed, and has a low specific resistivity so as to serve as a stabilizing material. Such a metal comprises, for example, silver and silver alloy.

The metal covering may be used as an intermediate layer. In this case, another metal, such as copper, aluminum, or an alloy thereof, is covered over the intermediate layer.

By establishing the thickness of the high temperature superconductor to a thickness of approximately 10% or less than the thickness of the wire, reduction of critical current density can be maintained within a practical range even if the wire is bent at a bending strain of, for example, 0.3%. In the wire according to the present invention, the superconductor portion comprises a fine filament, for example a filament having a thickness of several $\mu m$–50 $\mu m$. If the thickness of the superconductor exceeds 10% of the thickness of the wire, decrease in critical current density by bending becomes significant. More preferably, the decrease of critical current density by bending can further be suppressed by making the thickness of the superconductor 5% or less than the thickness of the wire.

The multifilamentary superconducting wire according to the present aspect is formed by bundling only once, strands having an oxide superconductor covered with a metal. In this wire, the distance between the superconductors is substantially constant so that the critical current density is high.

The number of strands to be bundled is preferably at least 30 in the normally used size so that the ratio of the oxide superconductor to the metal covering is not lowered.

The multifilamentary superconducting wire according to the present aspect can include at least a portion which is subjected to bending work to have a bending strain of 0.3% or below. This multifilamentary superconducting wire having a bending strain of 0.3% or below has reduction of the critical current density suppressed.

The multifilamentary superconducting wire can preferably be used for the steps of winding and unwinding under a condition of a bending strain of 0.3% or below. Degradation of the superconductive characteristic of a wire can be prevented within a range of a bending strain of 0.3% or below.

The multifilamentary superconducting wire can be wound around a reel or a drum under the tape-type wire configuration to be used for cables or coils. In winding, a bending strain of 0.3% or below gives the advantage of maintaining a high critical current density and providing a wire for practical usage. The multifilamentary superconducting wire can be applied to various wires that are worked at a bending strain of 0.3% or below.

According to a further aspect of the present invention, a method is provided for manufacturing a high temperature superconducting wire of multifilaments, including the steps of: preparing a plurality of strands having an oxide superconductor covered with a first metal sheath; bundling the plurality of strands to be packed in a second metal sheath so that each multifilamentary oxide superconductor is separated by a metal sheath material of substantially equal thickness; applying at least once, plastic working to exert compressive load towards the sectional direction of the second metal sheath having the plurality of strands packed therein.

In the method according to the present invention, the plastic working includes the steps of drawing and applying compressive load. When a round wire is to be obtained, drawing work is employed. When a flat tape-type wire is to be obtained, drawing, and then compression load is applied.

The method according to the present invention preferably includes the step of thermal treatment after the plastic working. In this case, it is further preferable that the working process and the thermal treatment are repeated several times.

In the method according to the present invention, it is possible to control the thickness of the oxide superconductor of the wiring obtained in the plastic working step by changing the number of strands packed in the second metal sheath. The thickness of the superconductor is preferably made to be 10% of the thickness of the wire.

In the method according to the present invention, the plurality of strands are bundled only once so that the oxide superconductors are spaced by the metal sheath material of substantially equal thickness. The strands bundled once gives the advantage of yielding a multifilamentary superconducting wire having superconductors of equal thickness distributed uniformly on the cross-section thereof. Such a multifilamentary wire maintains relatively high critical current density even if bending work is applied.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Oxides or carbonates including appropriate elements were mixed to have a composition of Bi:Pb:Sr:Ca:Cu=1.79:0.43:1.99:2.22:3.00. Then, heat treatment was carried out to prepare powder consisting of a 2212 phase where the ratio of Bi:Pb:Sr:Ca:Cu is approximately 2:2:1:2 and a non-superconducting phase. The powder was degassed for 12 hours at 710° C. under a decompressed atmosphere of 10 Torr. The powder of this high temperature superconductor was used in embodiments 1 and 2 and the comparison example.

Embodiment 1

The above-described powder was filled into a silver pipe having an outer diameter of 12 mm and an inner diameter of 9 mm and was drawn to 1.0 mm diameter. 60 of these strands were packed into a silver pipe having an outer diameter of 12 mm and an inner diameter of 9 mm. A silver rod of 1.0 mm in diameter was displaced in the center of the silver pipe with the above-described strands arranged around the rod.

Embodiment 2

The above-described powder was filled into a silver pipe having an outer diameter of 12 mm and an inner diameter of 9 mm to be drawn to 1.29 mm diameter. 36 of these strands were stacked into a silver pipe having an outer diameter of 12 mm and an inner diameter of 9 mm. A silver rod of 1.29 mm in diameter was disposed at the center of the silver pipe with the above-described strands arranged around the rod.

COMPARISON EXAMPLE

The above-described powder was filled into a silver pipe having an outer diameter of 6 mm and an inner diameter of 5 mm to be drawn to 1.3 mm diameter. Six of these strands were packed into a silver pipe having an outer diameter of 6 mm and an inner diameter of 4 mm. A silver rod of 1.3 mm in diameter was disposed at the center of the silver pipe. The six packed strands were drawn to 1.3 mm diameter and packed into a silver pipe having an outer diameter of 6 mm and an inner diameter of 4 mm. A silver rod of 1.3 mm in diameter was disposed at the center of a silver pipe with the drawn strands packed around the rod.

Figure 1:
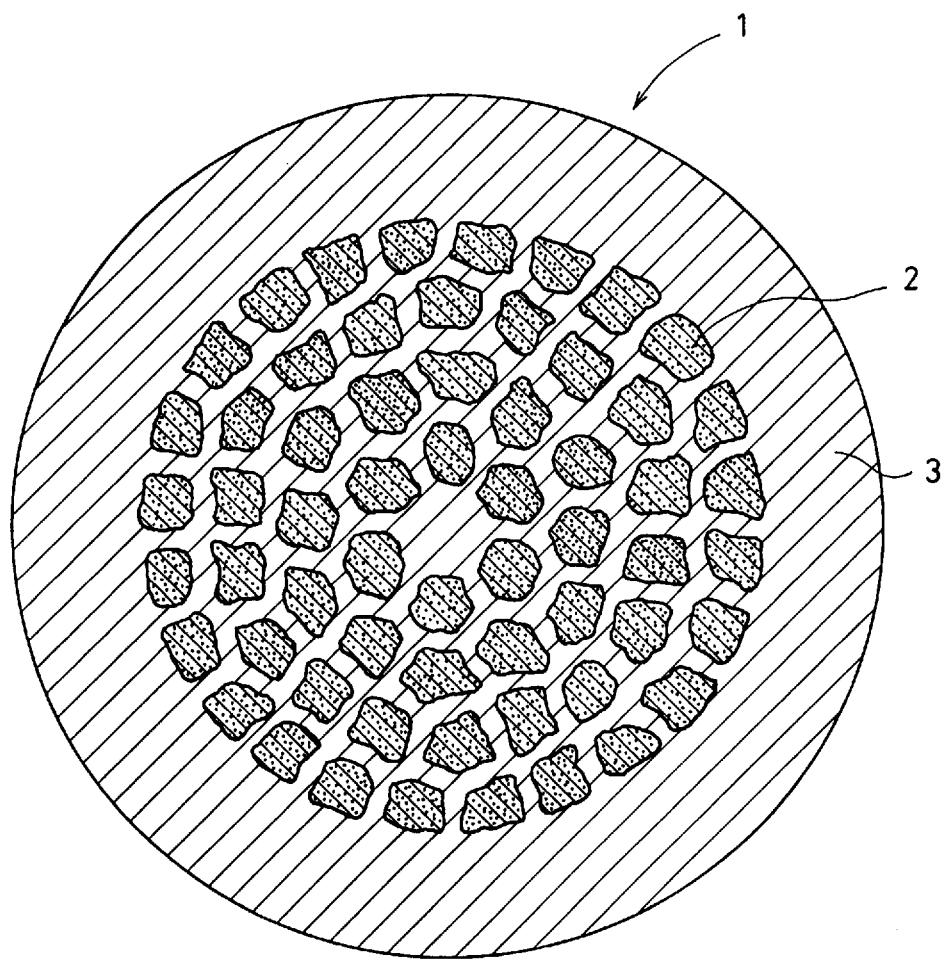
FIG. 1 is a sectional view of a wire after drawing work is applied according to a first embodiment of the present invention.
Figure 2:
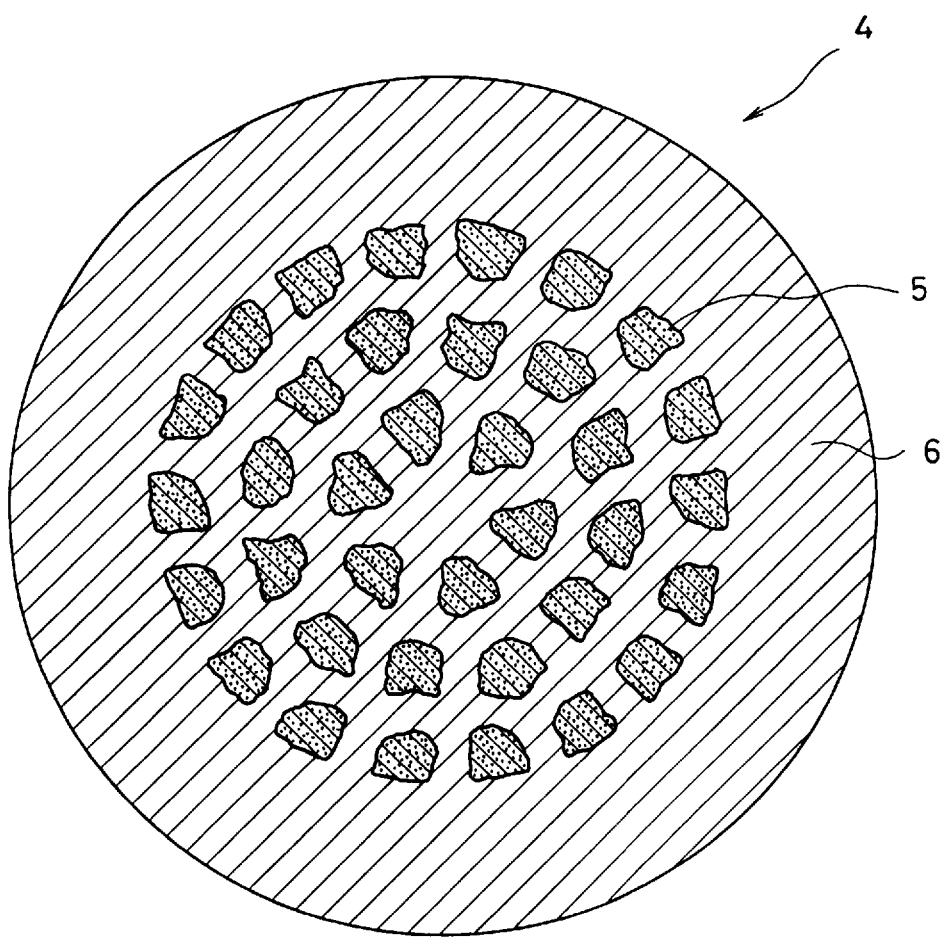
FIG. 2 is a sectional view of a wire after drawing work is applied according to a second embodiment of the present invention.
Figure 3:
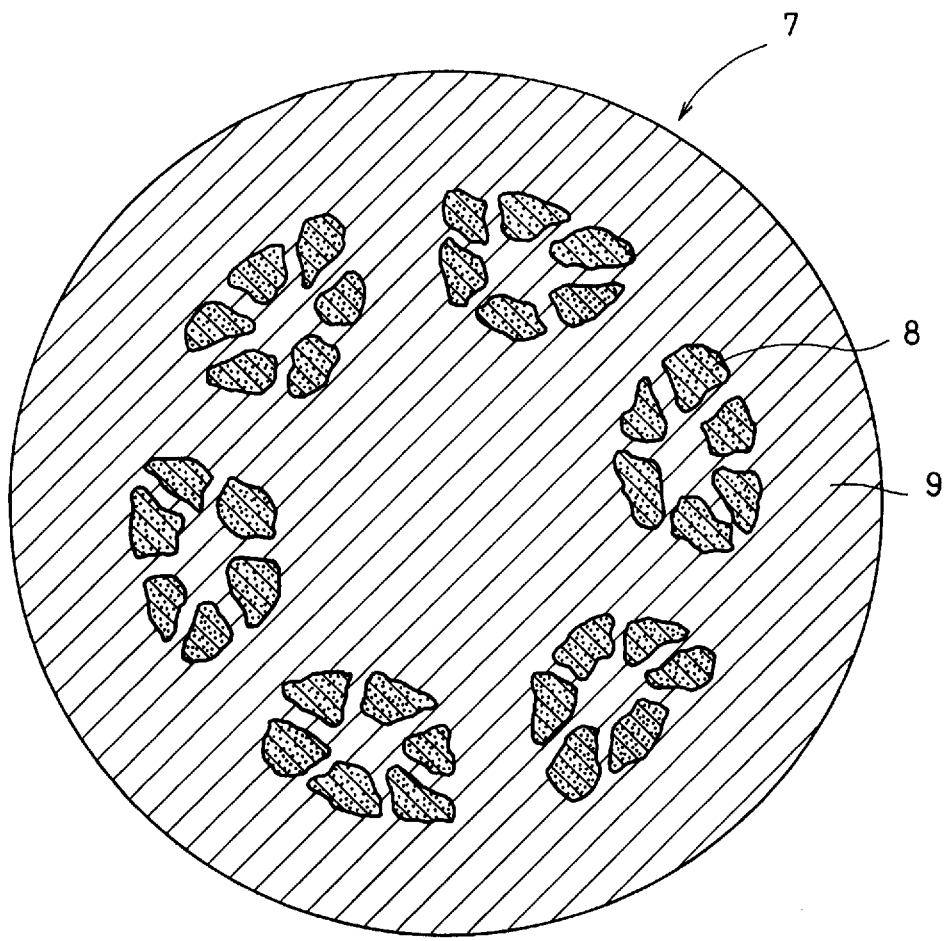
FIG. 3 is a sectional view of a wire after drawing work is applied of a conventional example.

The composite material obtained in the first and second embodiments and the comparison example, i.e. the packed material was drawn to 1.45 mm diameter. These wires were sampled to observe the cross-sectional structures thereof. FIGS. 1–3 show the sectional views of embodiment 1, embodiment 2, and the comparison example, respectively.

Referring to FIG. 1, wire 1 subjected to drawing work of embodiment 1 has a plurality of high temperature superconductors 2 disposed in a stabilizing material 3. Stabilizing material 3 of equal thickness exists between each high temperature superconductor 2.

Referring to FIG. 2, wire 4 subjected to drawing work of embodiment 2 has high temperature superconductors 5 disposed in a stabilizing material 6. Stabilizing material 6 of substantially equal thickness exists between each high temperature superconductor 5.

Referring to FIG. 3, a wire 7 subjected to drawing work of the comparison example has high temperature superconductors 8 disposed in a stabilizing material 9. High temperature superconductors 8 are present in a locally gathered manner. The thickness of stabilizing material 9 between each high temperature superconductor 8 is not constant.

The wires of the first and second embodiments and the comparison example subjected to drawing work were rolled-worked until the thickness was 0.435 mm. This wire was sintered for 50 hours at 845° C. and then subjected to rolling work again to a thickness of 0.326 mm. This processed wire was sintered again for 50 hours at 840° C.

Figure 4:
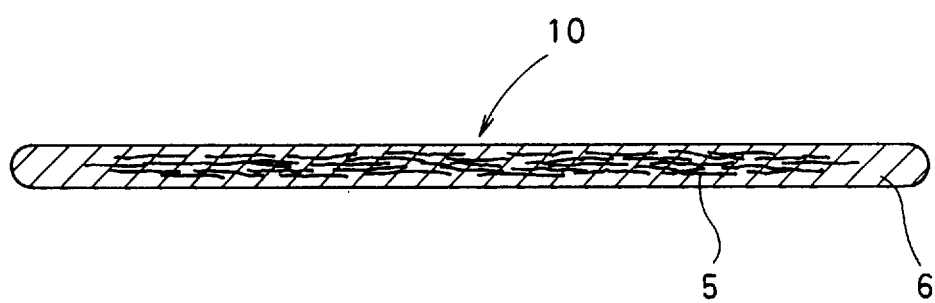
FIG. 4 is a sectional view showing a tape-type wire where the wire after drawing of the second embodiment of the present invention is subjected to rolling work.

FIG. 4 shows a tape-type wire of the drawn wire of embodiment 2 of FIG. 2 subjected to the rolling work of the above-described steps. Referring to FIG. 4, high temperature superconductor 5 exists in stabilizing material 6 in tape-type superconducting wire 10, wherein high temperature superconductor 5 extends breadthwise with substantially equal thickness.

The above-obtained tape-type wires of embodiments 1 and 2 and the comparison example had the critical current density (Jc) measured. The critical current density was also measured after the wire was subjected to a bending strain of 0.5% for 10 times. The bending strain is as defined before. The measured results of the critical current density are shown in Table 1.

TABLE 1

|  | Jc ($10^4$ A/cm$^2$) | Jc (0.5% Bending Strain × 10) ($10^4$ A/cm$^2$) |
| --- | --- | --- |
| Embodiment 1 | 1.9 | 1.7 |
| Embodiment 2 | 2.0 | 1.6 |
| Comparison Example | 1.5 | 1.0 |

It can be appreciated from Table 1 that the critical current density even after the wire was subjected to bending strain is superior in the tape-type wires of embodiments 1 and 2 according to the present invention in comparison with that of the comparison example.

Embodiment 3

Oxides or carbonates were mixed to have a composition of Bi:Pb:Sr:Ca:Cu=1.84:0.36:1.99:2.18:3.00. The mixed powder was thermal treated to obtain powder mainly consisting of a 2212 phase of 85% and a 2223 phase of 15% as the superconducting phase, and $(Ca, Sr)_2PbO_4$ and $Ca_2CuO_3$ as the non-superconducting phase. This powder was degassed for 12 hours at 700° C. under a decompressed atmosphere of 10 Torr.

The treated powder was covered with a silver pipe having an outer diameter of 12 mm and an inner diameter of 9 mm, whereby the silver pipe was subjected to drawing work till the diameter was 1.3 mm.

A predetermined number of the obtained strands were packed into a silver pipe of a predetermined size, shown in the following Table 2, whereby the silver pipe was subjected to drawing work until the diameter was 1.0 mm. Then, the obtained wire was rolled to a thickness of 0.30 mm.

Next, the obtained wire was thermal treated for 55 hours at 845° C., followed by a rolling work of 15% rolling reduction.

Six types of tape-type wires, as shown in the following Table 2 were obtained.

TABLE 2

| No. | Numbers of Bundled Strands | Silver Pipe Size (mm) Outer Diameter | Silver Pipe Size (mm) Inner Diameter | $\frac{\text{Superconductor Thickness}}{\text{Wire Thickness}} \times 100(\%)$ |
|---|---|---|---|---|
| 1 | 168 | 26 | 19.5 | 4.0 |
| 2 | 90 | 19 | 14.3 | 5.4 |
| 3 | 60 | 15.6 | 11.7 | 6.6 |
| 4 | 36 | 12 | 9.0 | 8.6 |
| 5 | 18 | 8.7 | 6.5 | 12 |
| 6 | 6 | 5.2 | 3.9 | 20 |

The percentage of the thickness of the semiconductor with respect to the thickness of the wire is also shown in Table 2.

These obtained six types of tape wires were respectively thermal treated for 48 hours at 838° C., and then bent at a predetermined diameter shown in the following Table 3. The critical current density (Jc) in liquid nitrogen of the wire bent at a predetermined diameter is shown in the following Table 3.

If bending strain is not exerted, Jc shows a tendency of increasing in the percentage of the thickness of the superconductor to the thickness of the wire. If bending strain is increased, reduction in Jc becomes significant as the percentage of the superconductor thickness increases. It is appreciated from Table 3 that approximately 90% or more of the initial Jc is retained in numbers 1–4 for a bending strain of 0.5%. However, numbers 5 and 6 maintain 80% or less of the initial Jc for a bending strain of 0.5%.

TABLE 3

| | 255 mmφ | | 128 mmφ | | 85 mmφ | | 64 mmφ | | 25 mmφ | |
|---|---|---|---|---|---|---|---|---|---|---|
| No. | A | B | A | B | A | B | A | B | A | B |
| 1 | 0.1 | 1.50 (100) | 0.2 | 1.50 (100) | 0.3 | 1.50 (100) | 0.4 | 1.50 (100) | 0.5 | 1.50 (100) |
| 2 | 0.1 | 1.70 (100) | 0.2 | 1.70 (100) | 0.3 | 1.70 (100) | 0.4 | 1.70 (100) | 0.5 | 1.70 (96) |
| 3 | 0.1 | 1.90 (100) | 0.2 | 1.90 (100) | 0.3 | 1.84 (97) | 0.4 | 1.82 (96) | 0.5 | 1.79 (94) |
| 4 | 0.1 | 2.0 (100) | 0.2 | 1.92 (96) | 0.3 | 1.84 (92) | 0.4 | 1.80 (90) | 0.5 | 1.76 (88) |
| 5 | 0.1 | 2.1 (100) | 0.2 | 1.95 (93) | 0.3 | 1.83 (87) | 0.4 | 1.74 (83) | 0.5 | 1.63 (78) |
| 6 | 0.1 | 2.2 (100) | 0.2 | 2.00 (93) | 0.3 | 1.83 (83) | 0.4 | 1.72 (78) | 0.5 | 1.63 (74) |

A: Bending Strain (%)
B: Jc (×10⁴ A/cm²)
The values in the parenthesis indicate the percentage (100%) of the Jc after the work process with respect to the Jc prior to the work process.

The obtained tape-type wire was bent at a predetermined diameter shown in Table 4 for 200 times, and the critical current density in liquid nitrogen was measured. The result is shown in the following Table 4.

TABLE 4

| | 255 mmφ | | 128 mmφ | | 85 mmφ | | 64 mmφ | | 25 mmφ | |
|---|---|---|---|---|---|---|---|---|---|---|
| No. | A | B | A | B | A | B | A | B | A | B |
| 1 | 0.1 | 1.50 (100) | 0.2 | 1.50 (100) | 0.3 | 1.41 (94) | 0.4 | 1.08 (72) | 0.5 | 1.90 (60) |
| 2 | 0.1 | 1.70 (100) | 0.2 | 1.62 (95) | 0.3 | 1.53 (90) | 0.4 | 1.14 (67) | 0.5 | 0.88 (52) |
| 3 | 0.1 | 1.90 (100) | 0.2 | 1.77 (93) | 0.3 | 1.62 (85) | 0.4 | 1.10 (58) | 0.5 | 0.72 (38) |
| 4 | 0.1 | 1.90 (95) | 0.2 | 1.78 (89) | 0.3 | 1.64 (82) | 0.4 | 0.84 (42) | 0.5 | 0.62 (31) |
| 5 | 0.1 | 1.47 (70) | 0.2 | 1.23 (59) | 0.3 | 1.07 (51) | 0.4 | 0.46 (22) | 0.5 | 0.32 (15) |
| 6 | 0.1 | 1.41 (64) | 0.2 | 1.14 (52) | 0.3 | 0.97 (44) | 0.4 | 0.44 (20) | 0.5 | 0.31 (14) |

A: Bending Strain (%)
B: Jc (×10⁴ A/cm²)
The values in the parenthesis indicate the percentage (100%) of the Jc after the work process with respect to the Jc prior to the work process.

It can be understood from Table 4 that a bending strain of 0.3% or more repeated for 200 times significantly decreased the Jc. Numbers 5 and 6 indicated a further significant decrease of Jc.

Sixty of the aforementioned strands were packed into a silver pipe of 16.5 mm in outer diameter and 13.3 mm in inner diameter to be subjected to drawing work to a diameter 1.0 mm. Then, rolling work was applied until the thickness was 0.17 mm.

The obtained wire was thermal treated for 55 hours at 845° C. and then subjected to rolling work at a rolling reduction of 15%. The obtained tape-type wire was wound around a cylinder of 50 mm in outer diameter to be thermal treated for 50 hours at 840° C.

This wire was supplied from the cylinder to be wound around a teflon pipe of 50 mm diameter at a pitch of 80 mm. The critical current density of this coil was measured in liquid nitrogen. The unwound wire was bent for 200 times at a radius of 100 mm, and then the critical current density was measured in liquid nitrogen. The measured critical current density was stable in both cases showing 14,600–15,700 A/cm². It was found that the tape-type wire had favorable property going through sintering and bending process.

Embodiment 4

Oxides or carbonates were mixed to have a composition of Bi:Pb:Sr:Ca:Cu=1.80:0.38:2.00:1.97:3.00. The mixed powder was thermal treated to obtain powder consisting mainly of 88% of a 2212 phase and 12% of a 2223 phase as the superconductor phase, and $(Ca, Sr)_2PbO_4$ and $Ca_2CuO_3$ as the non-superconducting phase. This power was degassed for 18 hours at 700° C. under a decompressed atmosphere of 7 Torr.

The obtained powder was covered with a silver pipe of 12 mm in outer diameter and 9 mm in inner diameter, to be drawn to a diameter of 1.3 mm.

A predetermined number of the above-described obtained strands were packed into a silver pipe of a predetermined size, indicated in Table 5, to be subjected to drawing work until the diameter was 1 mm. Then, the obtained wire was subjected to rolling work to a thickness of 0.28 mm. This wire was thermal treated for 45 hours at 845° C. and then subjected to rolling at a rolling reduction of 22%. The tape-type wire was thermal treated for 50 hours at 840° C.

TABLE 5

| No. | Numbers of Bundled Strands | Silver Pipe Size (mm) Outer Diameter | Silver Pipe Size (mm) Inner Diameter | Superconductor Thickness / Wire Thickness × 100(%) |
|---|---|---|---|---|
| 1 | 168 | 26 | 19.5 | 4.0 |
| 2 | 90 | 19 | 14.3 | 5.4 |
| 3 | 60 | 15.6 | 11.7 | 6.6 |
| 4 | 36 | 12 | 9.0 | 8.6 |
| 5 | 18 | 8.7 | 6.5 | 12 |
| 6 | 6 | 5.2 | 3.9 | 20 |

The above-obtained six types of wires were subjected to bending work at a diameter shown in the following Table 6 for 20 times. The critical current density was measured in liquid nitrogen. The results are shown in Table 6.

TABLE 5

| | 218 mmφ | | 109 mmφ | | 73 mmφ | | 55 mmφ | | 44 mmφ | |
|---|---|---|---|---|---|---|---|---|---|---|
| No. | A | B | A | B | A | B | A | B | A | B |
| 1 | 0.1 | 1.62 (100) | 0.2 | 1.62 (100) | 0.3 | 1.62 (100) | 0.4 | 1.28 (79) | 0.5 | 1.07 (66) |
| 2 | 0.1 | 1.73 (100) | 0.2 | 1.73 (100) | 0.3 | 1.73 (100) | 0.4 | 1.28 (74) | 0.5 | 0.99 (57) |
| 3 | 0.1 | 1.95 (100) | 0.2 | 1.95 (100) | 0.3 | 1.83 (94) | 0.4 | 1.25 (64) | 0.5 | 0.82 (42) |
| 4 | 0.1 | 1.96 (98) | 0.2 | 1.80 (90) | 0.3 | 1.70 (85) | 0.4 | 0.92 (46) | 0.5 | 0.68 (34) |
| 5 | 0.1 | 1.62 (77) | 0.2 | 1.37 (65) | 0.3 | 1.18 (56) | 0.4 | 0.50 (24) | 0.5 | 0.36 (17) |
| 6 | 0.1 | 1.54 (70) | 0.2 | 1.25 (57) | 0.3 | 1.06 (48) | 0.4 | 0.48 (22) | 0.5 | 0.33 (15) |

A: Bending Strain (%)
B: Jc (×10$^4$ A/cm$^2$)
The values in the parenthesis indicate the percentage (100%) of the Jc after the work process with respect to the Jc prior to the work process.

Reduction in Jc with respect to the same bending strand was significant for numbers 5 and 6 in comparison with those of numbers 1–4. The reduction in Jc was further significant when the repeated bending strain exceeded 0.3%.

Ninety of these obtained strands were bundled to manufacture a multifilamentary wire. The multifilamentary wire was drawn to 1.3 mm diameter and then subjected to rolling work until the thickness was 0.25 mm. The wire was thermal treated for 50 hours at 840° C.

The obtained wire was bent at a curvature of 50 mm in radius, and then restored to a linear configuration. This process was repeated for 20 times, followed by measurement of the critical current density in liquid nitrogen. The multifilamentary wire had a critical current density of 16,500–17,500 A/cm$^2$ in liquid nitrogen prior to the process of the bending work and also after the process of the bending work.

As set forth throughout the foregoing, the high temperature superconducting wire according to the present invention is particularly applicable to wires that undergo bending work such as cables, bus bars, current leads, and coils.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A superconducting tape, comprising:
   a plurality of oxide superconductor filaments, and
   a continuous stabilizing matrix of noble metal or noble metal alloy enclosing each of said plurality of oxide superconductor filaments,
   wherein each of said plurality of filaments has a ribbon shape,
   wherein said plurality of filaments are uniformly distributed in the cross section of said superconducting tape,
   wherein said stabilizing matrix has substantially equal thickness between each of said filaments,
   wherein each of said filaments has a thickness of not more than about 10% of the thickness of said superconducting tape, and
   wherein the critical current density of said tape remains at least 85% of the original when being subjected to a bending strain of 0.3% for 20 times.

2. The superconducting tape in accordance with claim 1, wherein said tape has at least 36 filaments.

3. The superconducting tape in accordance with claim 1, wherein said tape has a critical current density of between about 16,200 and 18,300 A/cm$^2$ at liquid nitrogen temperature after being subjected to the bending strain.

4. The superconducting tape in accordance with claim 1, wherein said oxide superconductor is selected from the group consisting of bismuth based oxide superconductors and thallium based oxide superconductors.

5. A superconducting wire, comprising:
   a plurality of oxide superconductor filaments, and
   a continuous stabilizing matrix of noble metal or noble metal alloy enclosing each of said plurality of oxide superconductor filaments,
   wherein said plurality of filaments are uniformly distributed in the cross section of said superconducting wire, said stabilizing matrix has substantially equal thickness between each of said filaments,
   wherein each of said filaments has a thickness of not more than about 10% of the thickness of said superconducting wire, and
   wherein the critical current density of said wire remains about 90% or more of the original after being subjected to a bending strain of 0.5%.

6. The superconducting wire in accordance with claim 5, wherein said wire has at least 36 filaments.

7. The superconducting wire in accordance with claim 5 wherein said wire maintains at least 92% of the original critical current density after being subjected to a bending strain of 0.3%.

8. The superconducting wire in accordance with claim 5, wherein said wire has a critical current density of between about 15,000 and 17,900 A/cm$^2$ at liquid nitrogen temperature after being subjected to the bending strain.

9. The superconducting wire in accordance with claim 5, wherein said oxide superconductor is selected from the group consisting of bismuth based oxide superconductors and thallium based oxide superconductors.

10. A superconducting wire, comprising:
    a plurality of oxide superconductor filaments, and
    a continuous stabilizing matrix of noble metal or noble metal alloy enclosing each of said plurality of oxide superconductor filaments, wherein said plurality of filaments are uniformly distributed in the cross section of said superconducting wire, said stabilizing matrix has substantially equal thickness between each of said filaments, wherein each of said filaments has a thickness of not more than about 10% of the thickness of said superconducting wire, and wherein said wire maintains at least 82% of the original critical current density after being subjected to a bending strain of 0.3% for 200 times.

11. The superconducting wire in accordance with claim 10, wherein said wire has a critical current density of between about 14,100 and 16,400 A/cm$^2$ at liquid nitrogen temperature after being subjected to the bending strain.

* * * * *